(12) United States Patent
Moon (10) Patent No.: US 12,183,947 B2
(45) Date of Patent: Dec. 31, 2024

(54) SEPARATOR, INCLUDING COMPOSITE COATING LAYER CONTAINING INORGANIC PARTICLES AND HYDROPHILIC ORGANIC COMPOUND ARRANGED ON WEB OF ORGANIC FIBERS, PREPARATION METHOD OF SAME, AND SECONDARY BATTERY COMPRISING SAME

(71) Applicant: SAMSUNG SDI CO., LTD., Yongin-si (KR)

(72) Inventor: Jungjin Moon, Yongin-si (KR)

(73) Assignee: SAMSUNG SDI CO., LTD., Yongin-si (KR)

( * ) Notice: Subject to any disclaimer, the term of this patent is extended or adjusted under 35 U.S.C. 154(b) by 587 days.

(21) Appl. No.: 17/436,758

(22) PCT Filed: Dec. 19, 2019

(86) PCT No.: PCT/KR2019/095050
§ 371 (c)(1),
(2) Date: Sep. 7, 2021

(87) PCT Pub. No.: WO2020/179998
PCT Pub. Date: Sep. 10, 2020

(65) Prior Publication Data
US 2022/0190440 A1  Jun. 16, 2022

(30) Foreign Application Priority Data
Mar. 6, 2019  (KR) ........................ 10-2019-0025857

(51) Int. Cl.
| | |
|---|---|
| *H01M 50/446* | (2021.01) |
| *H01M 10/0525* | (2010.01) |
| *H01M 50/403* | (2021.01) |
| *H01M 50/409* | (2021.01) |
| *H01M 50/414* | (2021.01) |
| *H01M 50/44* | (2021.01) |

(Continued)

(52) U.S. Cl.
CPC ....... *H01M 50/446* (2021.01); *H01M 50/403* (2021.01); *H01M 50/409* (2021.01);
(Continued)

(58) Field of Classification Search
CPC ............ H01M 50/446; H01M 50/489; H01M 50/454; H01M 50/414; H01M 50/403;
(Continued)

(56) References Cited

U.S. PATENT DOCUMENTS

| | | | |
|---|---|---|---|
| 6,447,958 B1 * | 9/2002 | Shinohara | ........... H01M 50/449 429/251 |
| 9,083,035 B2 | 7/2015 | Yeou et al. | |

(Continued)

FOREIGN PATENT DOCUMENTS

| | | | | |
|---|---|---|---|---|
| CN | 107248562 A | * | 10/2017 | ............ H01M 2/145 |
| CN | 109546057 A | * | 3/2019 | .......... H01M 50/403 |

(Continued)

OTHER PUBLICATIONS

International Search Report dated Apr. 28, 2020 for PCT/KR2019/095050.

*Primary Examiner* — Sean P Cullen
(74) *Attorney, Agent, or Firm* — Lee IP Law, P.C.

(57) ABSTRACT

The present disclosure relates to a separator, a method of preparing the separator, and a secondary battery comprising the separator, the separator including: a web structure of organic fibers; and a composite coating layer arranged on the organic fibers, wherein the composite coating layer includes heat-resistant inorganic particles and a hydrophilic organic compound.

19 Claims, 6 Drawing Sheets

(51) Int. Cl.
*H01M 50/454* (2021.01)
*H01M 50/489* (2021.01)
*H01M 50/491* (2021.01)

(52) U.S. Cl.
CPC ......... *H01M 50/414* (2021.01); *H01M 50/44* (2021.01); *H01M 50/454* (2021.01); *H01M 50/489* (2021.01); *H01M 10/0525* (2013.01); *H01M 50/491* (2021.01)

(58) Field of Classification Search
CPC ... H01M 50/44; H01M 50/409; H01M 50/491
USPC ........................................ 429/144, 251, 254
See application file for complete search history.

(56) References Cited

U.S. PATENT DOCUMENTS

| | | | |
|---|---|---|---|
| 9,362,567 | B2 | 6/2016 | Kim et al. |
| 9,431,659 | B2 | 8/2016 | Kim et al. |
| 10,693,116 | B2 | 6/2020 | Kim et al. |
| 2009/0233120 | A1* | 9/2009 | Maruyama ............. H05K 3/386 427/191 |
| 2019/0198840 | A1* | 6/2019 | Huang ................ H01M 50/426 |

FOREIGN PATENT DOCUMENTS

| | | | | |
|---|---|---|---|---|
| KR | 10-2013-0012492 | A | 2/2013 | |
| KR | 10-1283013 | B1 | 7/2013 | |
| KR | 10-2013-0107550 | A | 10/2013 | |
| KR | 10-2013-0118582 | A | 10/2013 | |
| KR | 10-1396270 | B1 | 5/2014 | |
| KR | 10-1593314 | B1 | 2/2016 | |
| KR | 2016126503 | A * | 11/2016 | .......... H01M 2/1646 |
| KR | 2016134046 | A * | 11/2016 | ........ H01M 10/0525 |
| KR | 10-2017-0118480 | A | 10/2017 | |
| WO | WO-2012128460 | A2 * | 9/2012 | ............... B05D 7/02 |

* cited by examiner

SEPARATOR, INCLUDING COMPOSITE COATING LAYER CONTAINING INORGANIC PARTICLES AND HYDROPHILIC ORGANIC COMPOUND ARRANGED ON WEB OF ORGANIC FIBERS, PREPARATION METHOD OF SAME, AND SECONDARY BATTERY COMPRISING SAME

CROSS REFERENCE TO RELATED APPLICATIONS

This is the U.S. national phase application based on PCT Application No. PCT/KR2019/095050, filed Dec. 19, 2019, which is based on Korean Patent Application No. 10-2019-0025857, filed Mar. 6, 2019, the entire contents of all of which are hereby incorporated by reference.

TECHNICAL FIELD

The present disclosure relates to a separator, a method of preparing the same, and a secondary battery including the same.

BACKGROUND ART

Lithium secondary batteries are used for various purposes due to their high voltage and high energy density. For example, in the field of electric vehicles (HEV and PHEV), lithium secondary batteries having excellent discharge capacity and lifespan characteristics are required because the batteries may operate at high temperature, should charge or discharge a large amount of electricity, and need to be used for a long time.

A lithium secondary battery is assembled by interposing a separator between a positive electrode and a negative electrode. The separator serves as a pathway of ions in the battery and prevents short circuits caused by direct contact between the positive electrode and the negative electrode.

To realize lithium secondary batteries having high capacity and high output power, research is proceeding in the direction of decreasing thickness of separators and increasing loading amounts of electrodes. However, as the thickness of a separator decreases, heat resistance and mechanical strength deteriorate, thereby causing a serious problem of deterioration of battery stability. To solve this problem, attempts have been made to provide an inorganic oxide coating layer on the surface of a separator. However, some pores are clogged by the inorganic oxide coating layer causing a problem of deterioration of its function as a lithium-ion pathway.

Therefore, there is still a need to develop a separator having improved heat resistance and mechanical strength and also having excellent wettability by an organic electrolytic solution.

DESCRIPTION OF EMBODIMENTS

Technical Problem

Provided is a separator having improved heat resistance and mechanical strength and also having excellent wettability by an organic electrolytic solution.

Solution to Problem

According to an aspect of the present disclosure, a separator includes:
a web structure of organic fibers; and
a composite coating layer arranged on the organic fibers, wherein the composite coating layer includes heat-resistant inorganic particles and a hydrophilic organic compound.

According to another aspect of the present disclosure, a method of preparing a separator includes:
providing a web structure of organic fibers;
vapor-depositing heat-resistant inorganic particles; and
forming a composite coating layer including a hydrophilic organic compound.

According to another aspect of the present disclosure, a secondary battery includes:
a positive electrode;
a negative electrode; and
the separator interposed between the positive electrode and the negative electrode.

Advantageous Effects of Disclosure

A secondary battery including a separator according to an aspect has excellent lifespan characteristics and high-rate characteristics due to excellent heat resistance, mechanical strength, and electrolyte-impregnation property of the separator.

<Explanation of Symbols of Main Components of Drawings>

| | |
|---|---|
| 1: Lithium Battery | 2: Negative Electrode |
| 3: Positive Electrode | 4: Separator |
| 5: Battery Case | 6: Cap Assembly |

MODE OF DISCLOSURE

The present inventive concept of the present disclosure described below allows for various changes and numerous embodiments, particular embodiments will be illustrated in the drawings and described in detail in the written description. However, this is not intended to limit the present disclosure to particular modes of practice, and it is to be appreciated that all modifications, equivalents, and substitutes that do not depart from the spirit and technical scope of the present disclosure are encompassed in the present disclosure.

The terms used herein are merely used to describe particular embodiments, and are not intended to limit the present disclosure. An expression used in the singular encompasses the expression of the plural, unless it has a clearly different meaning in the context. Hereinafter, it is to be understood that the terms such as "including" or "having" are intended to indicate the existence of features, numbers, operations, components, parts, elements, materials, or combinations thereof disclosed in the specification, and are not intended to preclude the possibility that one or more other features, numbers, operations, components, parts, elements, materials, or combinations thereof may exist or may be added. As used herein, the "/" may be interpreted as either "and" or "or" depending on situations.

In the drawings, diameters, lengths, and thicknesses of various components, layers and regions may be enlarged or reduced for clarity. Throughout the specification, like reference numerals denote like elements. Throughout the specification, it will be understood that when one element such as layer, film, region, or plate, is referred to as being "on" another element, it may be directly on the other element, or intervening elements may also be present therebetween. It will be understood that, although the terms first, second, etc. may be used herein to describe various components, these components should not be limited by these terms. These terms are only used to distinguish one component from another. Although some elements may be omitted in the drawings, this is for better understanding of characteristics of the present disclosure and is not intended to preclude the existence of the omitted elements.

Throughout the specification, the "composite coating layer" refers to a layer or region formed by physically mixing different materials or forming a chemical bond.

Hereinafter, an electrode for secondary batteries, a lithium secondary battery including the same, and a method of preparing the electrode for secondary batteries according to exemplary embodiments will be described in more detail.

A separator according to an embodiment includes: a web structure of organic fibers; and a composite coating layer disposed on the organic fibers, wherein the composite coating layer includes heat-resistant inorganic particles and a hydrophilic organic compound.

By disposing the composite coating layer including the heat-resistant inorganic particles and the hydrophilic organic compound on the organic fibers, both heat resistance and electrolyte-impregnation property of the organic fibers are improved.

The composite coating layer is a base film layer. In this regard, the "base film layer" means a base film which does not physically separated from the organic fibers. For example, the composite coating layer may be present as a layer covering the entire base film or the composite coating layer may be present as a layer covering a portion of the base film.

In the composite coating layer, the hydrophilic organic compound is configured to surround the heat-resistant inorganic particles. As will be described later, because such a base film layer is formed by atomic layer deposition, disadvantages of conventional polyethylene-based separators, i.e., poor impregnation property and thermal shrinkage at a high temperature, may be overcome without substantially increasing a thickness of the separator so that an electrolytic solution may be sufficiently impregnated even into the interior of the separator, thereby assisting migration of lithium ions.

The composite coating layer is arranged to surround the organic fibers. According to an embodiment, the composite coating layer is arranged to surround at least one portion of circumferences of the organic fibers. According to another embodiment, the composite coating layer is arranged to surround the entire circumferences of the organic fibers.

By disposing the composite coating layer to surround the organic fibers, not only deterioration by heat may be effectively prevented but also the impregnation property the surface of the separator with an electrolyte may be improved.

In the composite coating layer, an atomic ratio of Al atoms derived from the heat-resistant inorganic particles to nitrogen atoms derived from the hydrophilic organic compound is from 1:1 to 2:1.

A thickness of the composite coating layer is from 3 nm to 10 nm. As will be described later, in the separator according to an embodiment, the composite coating layer is formed by depositing a small amount of the heat-resistant inorganic particles on the web structure of organic fibers by atomic layer deposition and immersing the resultant in a dopamine solution. Accordingly, a uniform composite coating layer is formed throughout the interior and exterior of the web structure of organic fibers within a range not increasing the whole thickness of the separator thereby. Accordingly, heat resistance and electrolyte-impregnation property are improved throughout the interior and exterior of the separator, thereby improving durability, safety, and high-rate characteristics of a secondary battery. On the contrary, when the composite coating layer is formed on a porous film, it is difficult to form the composite coating layer inside the porous film making it difficult to improve the impregnation property and heat resistance of the interior of the porous film. In addition, the composite coating layer formed on the surface of the porous film may clog some pores of the porous film, and thus a problem of increasing resistance may be caused.

The web structure of organic fibers is porous. For example, a porosity of the web structure may be from 30% to 60%, and an average diameter of pores may be from 25 nm to 70 nm. When the porosity is less than 30%, the web structure may act as a resistance layer to lithium ions. When the porosity is greater than 60%, mechanical properties deteriorate, thereby increasing the risk of short circuits therein. In addition, when the average diameter of pores is less than 25 nm, the web structure acts as a resistance layer to lithium ions, thereby decreasing ionic conductivity. When the average diameter of pores is greater than 70 mm, mechanical properties may deteriorate, and thus the web structure may easily be torn during a manufacturing process or operation.

The organic fibers are fibers formed of an organic polymer. For example, the organic fibers may include polyethylene fibers, polypropylene fibers, polyisobutylene fibers, polyvinyl chloride fibers, polyvinylidene chloride fibers, polyvinylidenefluoride fibers, polymethylmethacrylate fibers, polyacrylonitrile fibers, polyvinylalcohol fibers, polyethyleneterephthalate fibers, polybutyleneterephthalate fibers, polyimide fibers, polyester fibers, polytetrafluoroethylene fibers, polyamide fibers, polyarylenesulfide fibers, or a combination thereof, but are not limited thereto, and include fibrous forms of any organic materials available as a base material of the separator.

The heat-resistant inorganic particles include an inorganic metal oxide, an inorganic metal hydroxide, or a combination thereof. For example, the heat-resistant inorganic particles may include $\alpha$-$Al_2O_3$, $\gamma$-$Al_2O_3$, Boehmite ($\gamma$-AlO(OH)), gibbsite ($\gamma$-Al(OH)$_3$), $SiO_2$, $TiO_2$, $SnO_2$, $CeO_2$, $ZrO_2$, CaO, MgO, NiO, ZnO, $Y_2O_3$, $BaTiO_3$, Al(OH)$_3$, Mg(OH)$_2$ or a combination thereof, but are not limited thereto, and any inorganic material having heat resistance may also be used. Because the heat-resistant inorganic particles have excellent mechanical properties and excellent heat resistance even under high temperature conditions such as overcharging, a secondary battery including a separator including the heat-resistant inorganic particles may have improved thermal stability.

The hydrophilic organic compound constitutes a self-assembled monolayer and includes an organic compound including a hydroxyl group and an amine group. In this regard, the "self-assembled monolayer" refers to a monolayer formed of organic compounds bound to each other via covalent bonds. For example, a compound for forming the self-assembled monolayer may consist of a head and a tail, and the head is bound to the surface and the tail is bound to an adjacent atom or compound or exposed to the outside to provide hydrophilicity.

The hydrophilic organic compound includes a catechol group and an amine group. For example, the hydrophilic organic compound may include dopamine, a dopamine derivative, or a combination thereof. The hydrophilic organic compound provides the separator with hydrophilicity, and thus the electrolyte-impregnation property may be improved. Thus, lithium ions may pass through the separator more easily and quickly, and as a result, charging/discharging characteristics at a high rate may be improved.

A thickness of the separator is from 5 μm to 100 μm. When the thickness of the separator is within the above range, the separator may serve as a lithium-ion migration pathway and short circuits between a positive electrode and a negative electrode may be inhibited.

The separator has a contact angle of 60° or less with an organic electrolytic solution. Here, the organic electrolytic solution may include a lithium salt and an organic solvent. For example, the separator may have a contact angle of 59° or less, 58° or less, 57° or less, or 56° or less with the organic electrolytic solution, without being limited thereto. The contact angle of the separator with the organic electrolytic solution may be 60° or less because the impregnation property is improved due to the hydrophilic organic compound included in the composite coating layer.

The separator may have a thermal shrinkage of less than 20% at 140° C. For example, the separator may have a thermal shrinkage of 19% or less, 18% or less, 17% or less, 16% or less, 15% or less, 14% or less, 13% or less, 12% or less, 11% or less, 10% or less, 9% or less, 8% or less, 7% or less, 6% or less, 5% or less, 4% or less, 3% or less, 2% or less, or 1% or less, at 140° C. Because thermal stability of the separator is improved by the heat-resistant inorganic particles included in the composite coating layer, structural distortion or thermal shrinkage of the separator was hardly observed at a high temperature.

According to an embodiment, a secondary battery including a positive electrode, a negative electrode, and the above-described separator is provided. The secondary battery includes lithium-sulfur batteries, lithium-air batteries, lithium-ion batteries, sodium-ion batteries, and all-solid batteries, but is not limited thereto, and may include any batteries capable of repeatedly providing electricity by charging and discharging.

For example, the secondary battery may be prepared according to a method as described below.

First, a positive electrode is prepared.

For example, a positive active material composition in which a positive active material, a conductive material, a binder, and a solvent are mixed is prepared. The positive active material composition is directly coated on a metallic current collector to prepare a positive electrode plate. Alternatively, the positive active material composition may be cast on a separate support and a film separated from the support may be laminated on a metallic current collector to prepare a positive electrode plate. The positive electrode is not limited to the forms described above and may be in any forms other than the above-described forms.

The positive active material may be any lithium-containing metal oxide commonly available in the art without limitation. For example, one or more types of composite oxides of lithium and a metal selected from cobalt, manganese, nickel, and a combination thereof may be used. For example, the lithium-containing metal oxide may be a compound represented by any one of the following formulae: $Li_aA_{1-b}B^1_bD^1_2$ (where $0.90 \le a \le 1.8$ and $0 \le b \le 0.5$); $Li_aE_{1-b}B^1_bO_{2-c}D^1_c$ (where $0.90 \le a \le 1.8$, $0 \le b \le 0.5$, and $0 \le c \le 0.05$); $LiE_{2+b}B^1_bO_{4-c}D^1_c$ (where $0 \le b \le 0.5$ and $0 \le c \le 0.05$); $Li_aN_{1-b-c}Co_bB^1_cD^1\alpha$ (where $0.90 \le a \le 1.8$, $0 \le b \le 0.5$, $0 \le c \le 0.05$, and $0 < \alpha \le 2$); $Li_aNi_{1-b-c}Co_bB^1_cO_{2-\alpha}F^1_\alpha$ (where $0.90 \le a \le 1.8$, $0 \le b \le 0.5$, $0 \le c \le 0.05$, and $0 < \alpha < 2$); $Li_aNi_{1-b-c}Co_bB^1_cO_{2-\alpha}F^1_2$ (where $0.90 \le a \le 1.8$, $0 \le b \le 0.5$, $0 \le c \le 0.05$, and $0 < \alpha < 2$); $Li_aNi_{1-b-c}Mn_bB^1_cD^1_\alpha$ (where $0.90 \le a \le 1.8$, $0 \le b \le 0.5$, $0 \le c \le 0.05$, and $0 < \alpha < 2$); $Li_aNi_{1-b-c}Mn_bB^1_cO_{2-\alpha}F^1_\alpha$ (where $0.90 \le a \le 1.8$, $0 \le b \le 0.5$, $0 \le c \le 0.05$, and $0 < \alpha < 2$); $Li_aNi_{1-b-c}Mn_bB^1_cO_{2-\alpha}F^1_2$ (where $0.90 \le a \le 1.8$, $0 \le b \le 0.5$, $0 \le c \le 0.05$, and $0 < \alpha < 2$); $Li_aNi_bE_cG_dO_2$ (where $0.90 \le a \le 1.8$, $0 \le b \le 0.9$, $0 \le c \le 0.5$, and $0.001 \le d \le 0.1$); $Li_aNi_bCo_cMn_dGeO_2$ (where $0.90 \le a \le 1.8$, $0 \le b \le 0.9$, $0 \le c \le 0.5$, $0 \le d \le 0.5$, and $0.001 \le e \le 0.1$); $Li_aNiG_bO_2$ (where $0.90 \le a \le 1.8$ and $0.001 \le b \le 0.1$); $Li_aCoG_bO_2$ (where $0.90 \le a \le 1.8$ and $0.001 \le b \le 0.1$); $Li_aMnG_bO_2$ (where $0.90 \le a \le 1.8$ and $0.001 \le b \le 0.1$); $Li_aMn_2GbO_4$ (where $0.90 \le a \le 1.8$ and $0.001 \le b \le 0.1$); $QO_2$; $QS_2$; $LiQS_2$; $V_2O_5$; $LiV_2O_5$; $LiI^1O_2$; $LiNiVO_4$; $Li_{(3-f)}J_2(PO_4)_3$ (where $0 \le f \le 2$); $Li_{(3-f)}OFe_2(PO_4)_3$ (where $0 \le f \le 2$); and $LiFePO_4$.

In the formulae above, A is Ni, Co, Mn, or any combination thereof; $B^1$ is Al, Ni, Co, Mn, Cr, Fe, Mg, Sr, V, a rear earth element, or any combination thereof; $D^1$ is O, F, S, P, or any combination thereof; E is Co, Mn, or any combination thereof; $F^1$ is F, S, P, or any combination thereof; G is Al, Cr, Mn, Fe, Mg, La, Ce, Sr, V, or any combination thereof; Q is Ti, Mo, Mn, or any combination thereof; I is Cr, V, Fe, Sc, Y, or any combination thereof; and J is V, Cr, Mn, Co, Ni, Cu, or any combination thereof.

For example, $LiCoO_2$, $LiMn_xO_{2x}$ (where x=1, 2), $LiNi_{1-x}Mn_xO_{2x}$ (where $0<x<1$), $LiNi_{1-x-y}Co_xMn_yO^2$ (where $0 \le x \le 0.5$ and $0 \le y \le 0.5$), and $LiFePO_4$ may be used.

The compounds may have a coating layer on the surface thereof or a mixture of the compound and a compound having a coating layer may also be used. The coating layer may include a compound of a coating element, such as, an oxide or hydroxide of the coating element, an oxyhydroxide of the coating element, an oxycarbonate of the coating element, or a hydroxycarbonate of the coating element. The compound constituting the coating layer may be amorphous or crystalline. The coating element contained in the coating layer may be Mg, Al, Co, K, Na, Ca, Si, Ti, V, Sn, Ge, Ga, B, As, Zr, or any mixture thereof. As a process of forming the coating layer, any coating method capable of forming the compound using these elements without adversely affect physical properties of the positive active material (e.g., spray coating and immersing). They are obvious to those of ordinary skill in the art, and thus detailed descriptions thereof will be omitted.

As the conductive material, carbon black, graphite fine particles, and the like may be used, without being limited thereto, and any materials commonly available in the art as conductive materials may also be used.

As the binder, a vinylidene fluoride/hexafluoropropylene copolymer, polyvinylidenefluoride (PVDF), polyacrylonitrile, polymethylmethacrylate, polytetrafluoroethylene and a mixture thereof, or a styrene butadiene rubber-based polymer, or the like may be used, without being limited thereto, and any material commonly available in the art as a binder may also be used.

As the solvent, N-methylpyrrolidone, acetone, or water may be used, without being limited thereto, and any solvent available in the art may be used.

Amounts of the positive active material, the conductive material, and the solvent are those commonly used in lithium batteries and an amount of the binder is as described above.

Next, a negative electrode is prepared.

For example, a negative active material composition is prepared by mixing a negative active material, a conductive material, a binder, and a solvent. The negative active material composition is directly coated on a metallic current collector and dried to prepare a negative electrode plate. Alternatively, the negative active material composition may be cast on a separate support and a film separated from the support may be laminated on a metallic current collector to prepare a negative electrode plate.

As the negative active material, any materials commonly available in the art as negative active materials of lithium batteries may be used. For example, the negative active material may include at least one selected from the group consisting of lithium metal, a metal alloyable with lithium, a transition metal oxide, a non-transition metal oxide, and a carbonaceous material.

For example, the metal alloyable with lithium may be Si, Sn, Al, Ge, Pb, Bi, Sb an Si—Y alloy (where Y is alkali metal, alkali earth metal, Group 13 element, Group 14 element, transition metal, rear earth element, or any combination thereof, except for Si), an Sn—Y alloy (where Y is alkali metal, alkali earth metal, Group 13 element, Group 14 element, transition metal, rear earth element, or any combination thereof, except for Sn), or the like. The element Y may be Mg, Ca, Sr, Ba, Ra, Sc, Y, Ti, Zr, Hf, Rf, V, Nb, Ta, db, Cr, Mo, W, Sg, Tc, Re, Bh, Fe, Pb, Ru, Os, Hs, Rh, Ir, Pd, Pt, Cu, Ag, Au, Zn, Cd, B, Al, Ga, Sn, In, Ti, Ge, P, As, Sb, Bi, S, Se, or Te.

For example, the transition metal oxide may be lithium titanium oxide, vanadium oxide, lithium vanadium oxide, or the like.

For example, the non-transition metal oxide may be $SnO_2$, $SiO_x$ (where $0<x<2$), or the like.

The carbonaceous material may be crystalline carbon, amorphous carbon, or any mixture thereof. The crystalline carbon may be graphite such as natural graphite or artificial graphite in amorphous, plate, flake, spherical or fibrous form, and the amorphous carbon may be soft carbon (carbon calcined at low temperature) or hard carbon, mesophase pitch carbide, calcine coke, or the like.

In the negative active material composition, the conductive material, the binder, and the solvent may be the same as those used in the positive active material composition.

Amounts of the negative active material, the conductive material, and the solvent may be those commonly used in lithium batteries, and an amount of the binder is as described above.

Subsequently, the above-described separator to be inserted between the positive electrode and the negative electrode is prepared.

A method of preparing a separator according to an embodiment includes:

providing a web structure of organic fibers; vapor-depositing heat-resistant inorganic particles; and forming a composite coating layer including a hydrophilic organic compound.

The vapor-depositing may be performed by chemical vapor deposition (CVD), atomic layer deposition (ALD), physical vapor deposition (PVD), or any combination thereof.

The chemical vapor deposition is a method of depositing a material to be deposited on a surface of a substrate by decomposing a gaseous source gas including the material to be deposited using energy such as heat or plasma.

The atomic layer deposition, as a deposition method of alternately supplying precursors including elements required for formation of a thin film such that atomic layers are adsorbed onto a substrate one by one, is easily used for deposition of a thin film having a uniform thickness of nanometer scale, particularly, in a complex three-dimensional structure.

The physical vapor deposition is a method of depositing a coating material on a surface of a substrate by evaporating the coating material in a vacuum state.

According to an embodiment, the vapor-depositing may be performed by atomic layer deposition. The vapor-depositing includes an operation of forming a layer of the heat-resistant inorganic particles with a uniform thickness of nanometer scale on the organic fibers in the web structure of organic fibers by atomic layer deposition. Because the web structure of organic fibers has a complex three-dimensional structure, it is advantageous to use atomic layer deposition for uniform deposition of inorganic particles even on the organic fibers inside the web structure.

According to conventional surface-coating methods for separators, surfaces of the separators are coated and thus it is inevitable to increase the thickness at a micrometer level. However, when atomic layer deposition and polydopamine dip coating, which will be described below, are used, coating at a nanometer level is possible. In addition, because the thickness of the separator is generally performed in a micrometer level, in the case where coating is performed in a nanometer level, it is determined that the thickness of the separator is maintained substantially the same, and thus beneficial effects on improving heat resistance and impregnation property may be obtained without increasing a volume of the separator.

The atomic layer deposition may be performed under the conditions of 40° C. for 8 minutes to 15 minutes in 25 times to 50 times. In the case of less than 25 times, sufficient heat resistance is not provided to the web structure of organic fibers, and in the case of greater than 50 times, sizes of pores present in the web structure of organic fibers may decrease or some the pores may be clogged so as to act as a resistant layer to lithium-ion migration pathway. Therefore, in terms of maintaining the function of the separator as a lithium-ion migration pathway while providing heat resistance to the separator, atomic layer deposition may be performed 25 times to 50 times.

The forming of the composite coating layer may be performed by dip coating, press coating, spin coating, spray coating, roller coating, or any combination thereof using a solution containing the hydrophilic organic compound.

For example, the forming of the composite coating layer may be performed by dip coating in which the web structure of organic fibers is immersed in a solution including a hydrophilic organic compound and then taken out after a preset time, e.g., 24 hours, followed by washing and drying. The hydrophilic organic compound, as a compound capable of forming a self-assembled monolayer as described above, may form a base film layer including heat-resistant inorganic particles via self-polymerization at a pH of 8.5 and under a tris(hydroxymethyl) aminomethane buffer solution and a methanol solvent.

Subsequently, an electrolyte is prepared.

For example, the electrolyte may be an organic electrolytic solution. In addition, the electrolyte may be a solid. For example, boron oxide, lithium oxynitride, or the like may be used without being limited thereto and those commonly available in the art as solid electrolytes may be used. The solid electrolyte may be formed on the negative electrode by a method such as sputtering.

For example, the organic electrolytic solution may be prepared by dissolving a lithium salt in an organic solvent.

The organic solvent may be any organic solvent commonly available in the art. For example, propylenecarbonate, ethylenecarbonate, fluoroethylenecarbonate, butylenecarbonate, dimethylcarbonate, diethylcarbonate, methylethylcarbonate, methylpropylcarbonate, ethylpropylcarbonate, methylisopropylcarbonate, dipropylcarbonate, dibutylcarbonate, benzonitrile, acetonitrile, tetrahydrofuran, 2-methyltetrahydrofuran, γ-butyrolactone, dioxorane, 4-methyldioxorane, N,N-dimethylformamide, dimethylacetamide, dimethylsulfoxide, dioxane, 1,2-dimethoxyethane, sulforane, dichloroethane, chlorobenzene, nitrobenzene, diethylene glycol, dimethylether, or any mixture thereof may be used.

The lithium salt may be any of those commonly available in the art as lithium salts. For example, $LiPF_6$, $LiBF_4$, $LiSbF_6$, $LiAsF_6$, $LiClO_4$, $LiCF_3SO_3$, $Li(CF_3SO_2)_2N$, $LiC_4F_9SO_3$, $LiAlO_2$, $LiAlCl_4$, $LiN(C_xF_{2x+1}SO_2)(C_yF_{2y+1}SO_2)$ (where x and y are natural numbers), LiCl, LiI, or any mixture thereof may be used.

Figure 6:
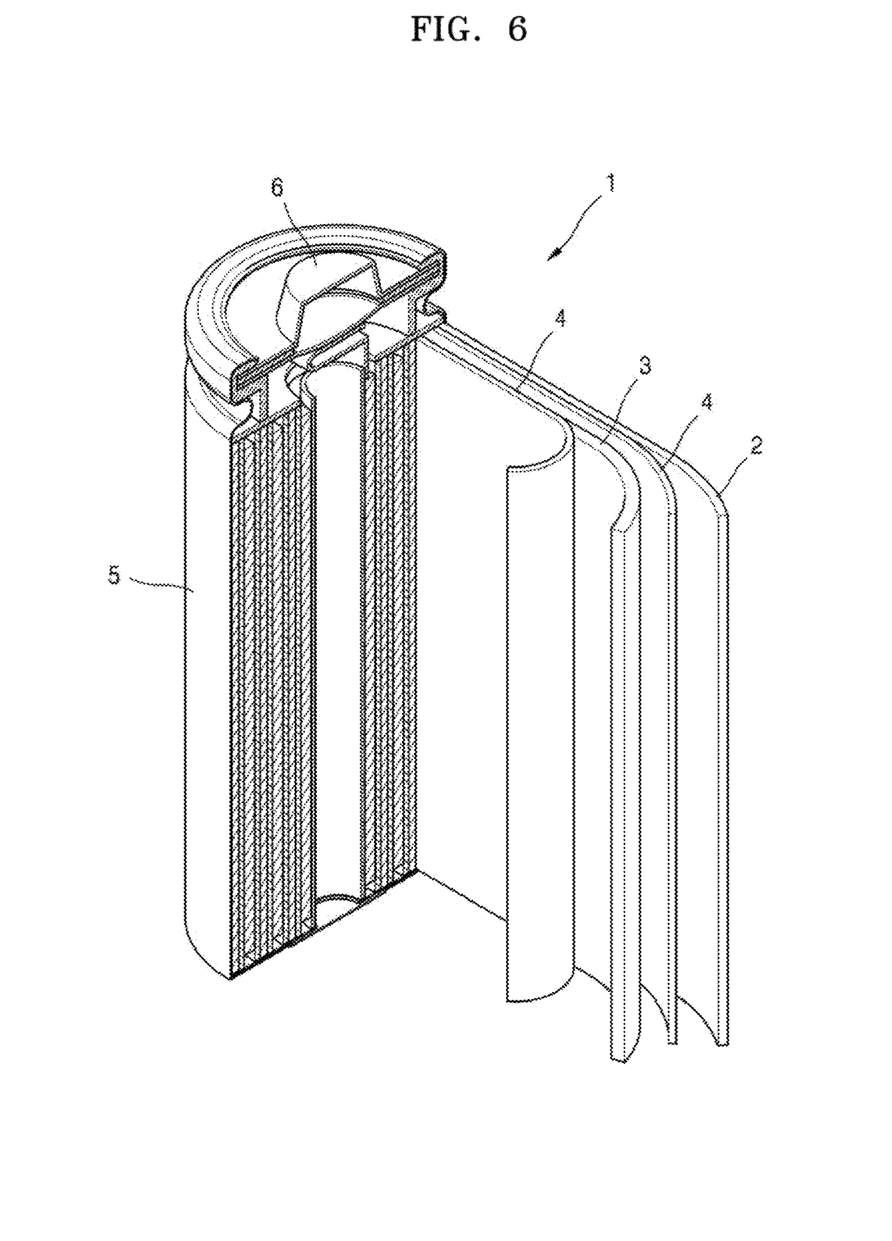
FIG. 6 is a schematic diagram showing a structure of a lithium secondary battery according to an embodiment.

As shown in FIG. 6, the lithium battery 1 includes a positive electrode 3, a negative electrode 2, and a separator 4. The above-described positive electrode 3, negative electrode 2, and separator 4 are wound or folded and then accommodated in a battery case 5. Subsequently, an organic electrolytic solution is injected into the battery case 5 and the battery case 5 is sealed with a cap assembly 6 to complete the manufacture of the lithium battery 1. The battery case 5 may have a cylindrical shape, a rectangular shape, or a thin-film shape. For example, the lithium battery 1 may be a thin-film type battery. The lithium battery 1 may be a lithium-ion battery.

The separator may be interposed between the positive electrode and the negative electrode to form a battery assembly. The battery assembly may be stacked in a bi-cell structure and impregnated with the organic electrolytic solution, and the resultant is accommodated in a pouch and sealed, thereby completing the manufacture of a lithium-ion polymer battery.

In addition, a plurality of battery assemblies may be stacked to form a battery pack and the battery pack may be used in any device that requires high capacity and high output power. For example, it may be used in notebook computers, smartphones, electric vehicles, and the like.

Also, the lithium battery having excellent lifespan characteristics and high-rate characteristics may be used in electric vehicles (EVs). For example, it may be used in hybrid electric vehicles (plug-in hybrid electric vehicles (PHEVs). Also, it may be used in the fields requiring a large amount of power storage. For example, it may be used in E-bikes, electric tools, and the like.

Hereinafter, the present disclosure will be described in more detail with reference to the following examples and comparative examples. However, the following examples are merely presented to exemplify the present disclosure, and the scope of the present disclosure is not limited thereto.

Example 1 (PE/Al$_2$O$_3$/PDA)

A polyethylene porous base material (SK innovation Co., Ltd.) having a thickness of 16 μm was prepared. After activating a surface of the polyethylene porous base material by the plasma treatment using an O$_2$ plasma device, Al$_2$O$_3$ was deposited thereon by ALD. Deposition of Al$_2$O$_3$ was performed by sequentially repeating exposure/purge of the surface to/from precursors, i.e., trimethylaluminum (TMA) and H$_2$O, and inert gas, i.e., nitrogen (N$_2$), as a carrier gas, i.e., and 1 cycle of ALD consists of exposure to TMA/purge with N$_2$/exposure to H$_2$O/purge with N$_2$ performed on the substrate. In this regard, N$_2$ is used to prevent unnecessary reaction/products. By one cycle, formation of one Al$_2$O$_3$ layer is completed, and 25 cycles were performed on the polyethylene base material in a chamber at 40° C.

Subsequently, dopamine hydrochloride (2 mg/ml) was dissolved in a mixture of tris(hydroxymethyl) aminomethane buffer (10 mM) and a methanol solvent (1:1) for PDA coating. After polymerization while stirring at room temperature for 24 hours, the ALD-coated substrate was impregnated for 18 hours and the separated was taken out and washed with distilled water, and then dried in a vacuum oven to prepare a separator.

Comparative Example 1 (PE)

A polyethylene porous base material (SK Innovation Co., Ltd.) having a thickness of 16 μm was prepared.

Comparative Example 2 (PE/Al$_2$O$_3$)

A polyethylene porous base material (SK Innovation Co., Ltd.) having a thickness of 16 μm was treated with oxygen plasma to activate the surface. A separator was obtained using trimethylaluminum (TMA) and H$_2$O as precursors by sequentially repeating 25 ALD cycles each cycle including exposure to TMA/purge and exposure to H$_2$O/purge (1 ALD cycle) at 40° C.

Comparative Example 3 (PE/PDA)

As a solvent, a mixed solvent of tris(hydroxymethyl) aminomethane buffer (10 mM) and a methanol solvent (1:1) was used and dopamine hydrochloride (2 mg/ml) was dissolved therein and stirred at room temperature for 24 hours for polymerization. A polyethylene porous base material (SK Innovation Co., Ltd.) having a thickness of 16 μm was treated with oxygen plasma to activate the surface and immersed in a prepared PDA solution at 25° C. for 18 hours for PDA coating. The coated separator was washed with distilled water and dried in a vacuum chamber to obtain a separator.

Evaluation Example 1 (SEM Image Analysis)

Figure 1:
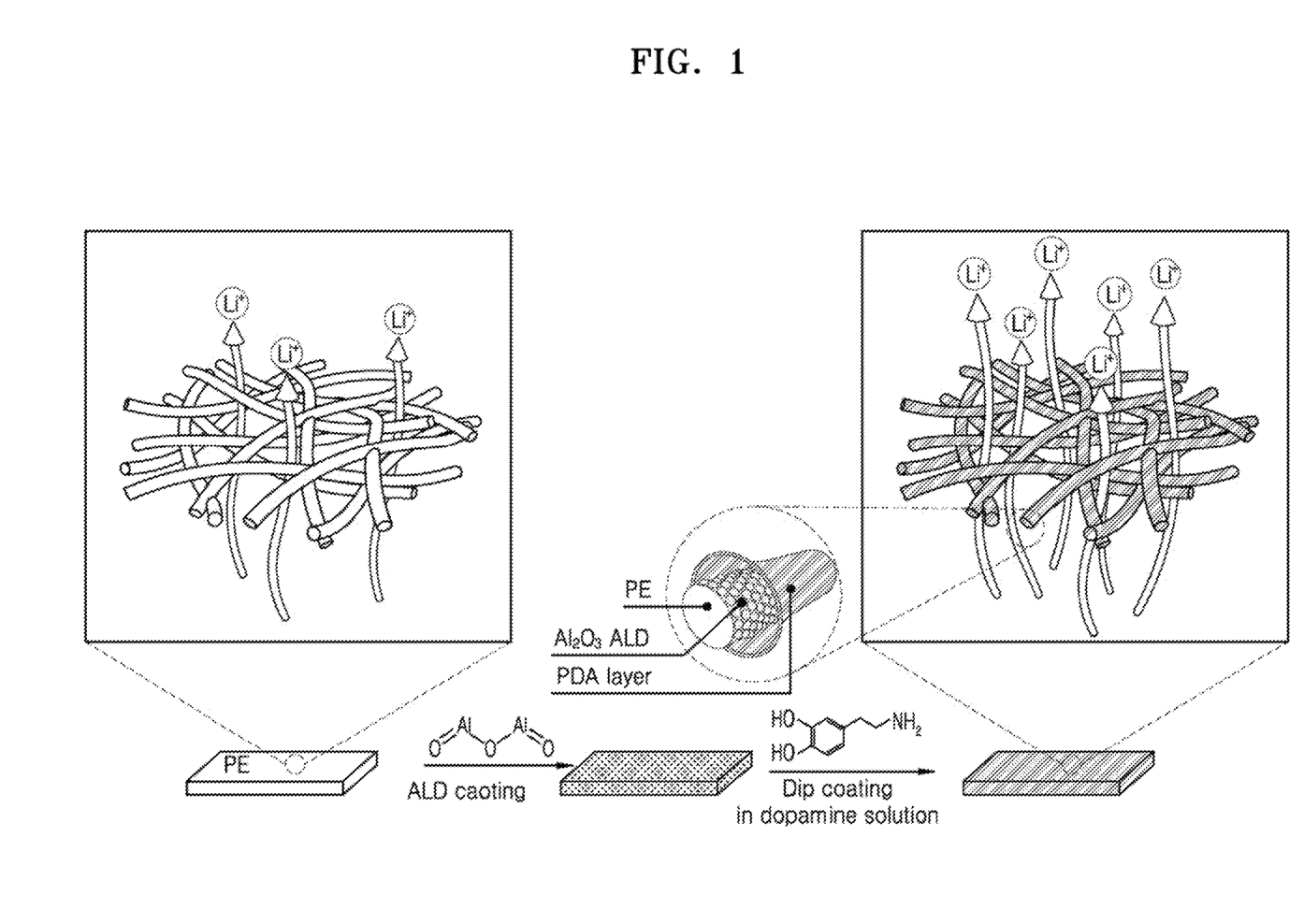
FIG. 1 is a flowchart showing a method of preparing a separator according to an embodiment of the present disclosure.
Figure 2:
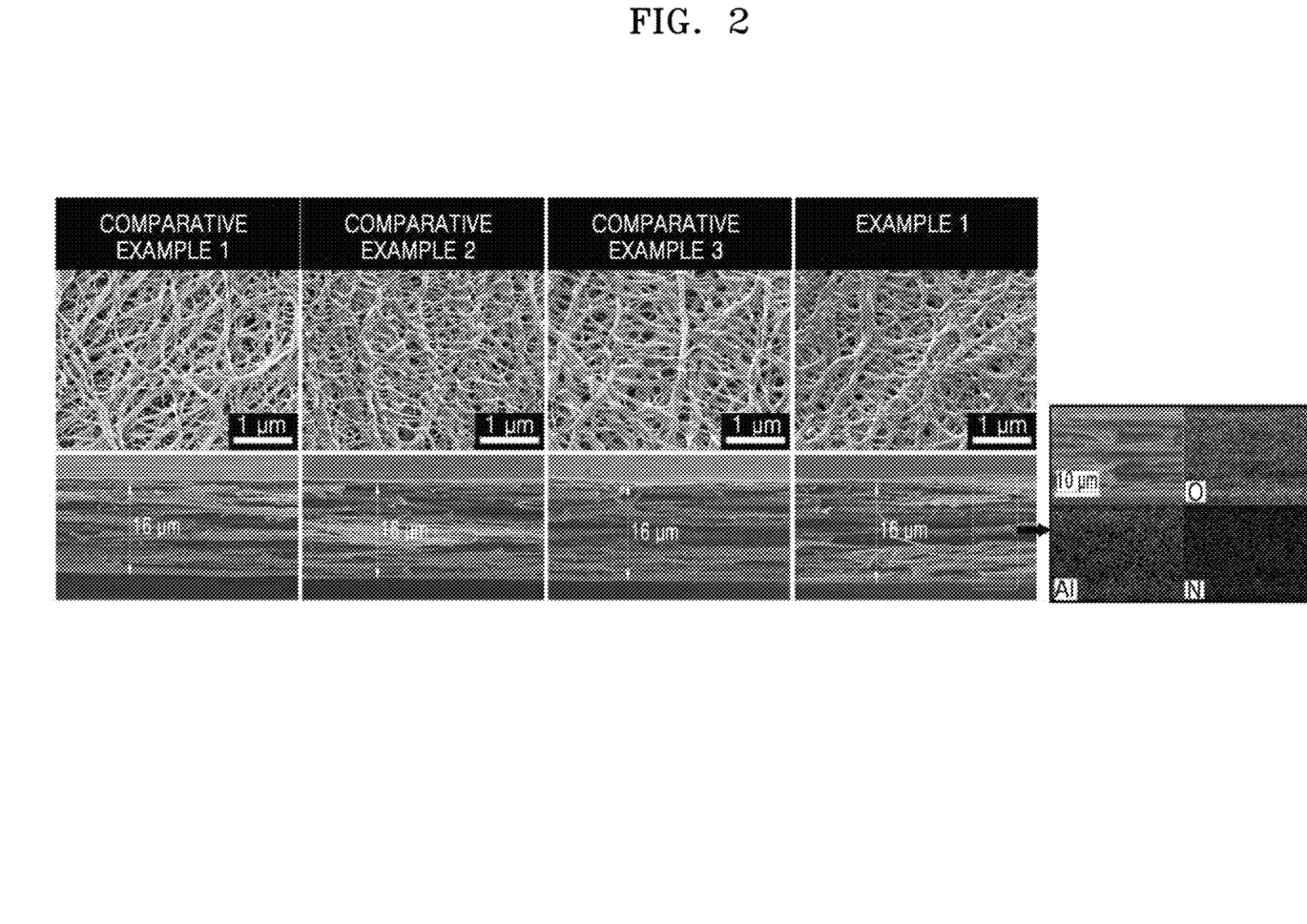
FIG. 2 shows scanning electron microscope (SEM) images of separators prepared in Example 1 and Comparative Examples 1 to 3.

Surfaces and cross-sections of the separators prepared in Example 1 and Comparative Examples 1 to 3 were analyzed using a scanning electron microscope (SEM) and SEM images are shown in FIG. 2.

Referring to FIG. 2, it was confirmed that $Al_2O_3$ and PDA coating were uniformly formed over the organic fibers in Example 1. In addition, referring to cross-sections of Example 1 and Comparative Examples 1 to 3, it was confirmed that the thicknesses of the cross-sections were substantially the same as 16 μm. Therefore, in the separator of Example 1, a uniform composite coating layer was formed over organic fibers while maintaining the same thickness as an initial thickness of the web structure of the organic fibers (PE).

Based on EDS mapping, aluminum (Al) and oxygen (O) obtained from $Al_2O_3$ and nitrogen (N) obtained from PDA were uniformly detected from the cross-section of the separator, and thus it was confirmed that uniform coating was formed even inside the separator.

Evaluation Example 2 (Evaluation of Thermal Shrinkage)

Figure 3:
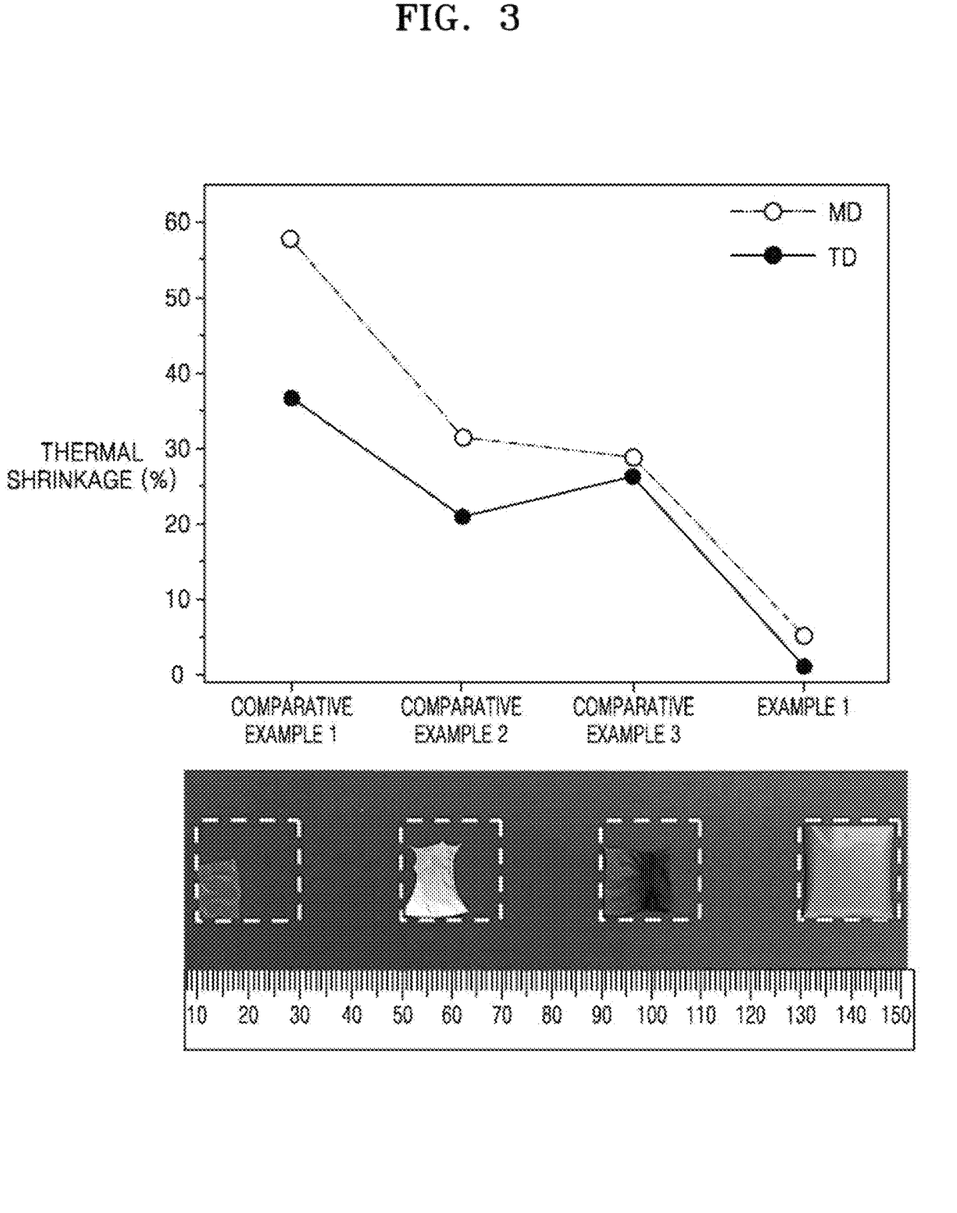
FIG. 3 is a graph showing thermal shrinkage of separators prepared in Example 1 and Comparative Examples 1 to 3.

Thermal shrinkages of the separators prepared in Example 1 and Comparative Examples 1 to 3 were measured at 140° C., and the results are shown in FIG. 3.

Referring to FIG. 3, in the case of Example 1 including the composite coating layer of $Al_2O_3$/PDA, it was confirmed that thermal shrinkage was significantly reduced, when compared with those of Comparative Examples 2 and 3 which include either one of $Al_2O_3$ and PDA. While 5% or less of thermal shrinkage was observed in the fibers in both mechanical direction (MD) and transverse direction (TD) in the case of Example 1, 20% or more thermal shrinkages were observed in both MD and TD in Comparative Examples 1 to 3.

Therefore, it may be seen that heat-resistance may be improved by including the composite coating layer of $Al_2O_3$/PDA as in Example 1.

Evaluation Example 3 (Evaluation of Wettability)

Figure 4:
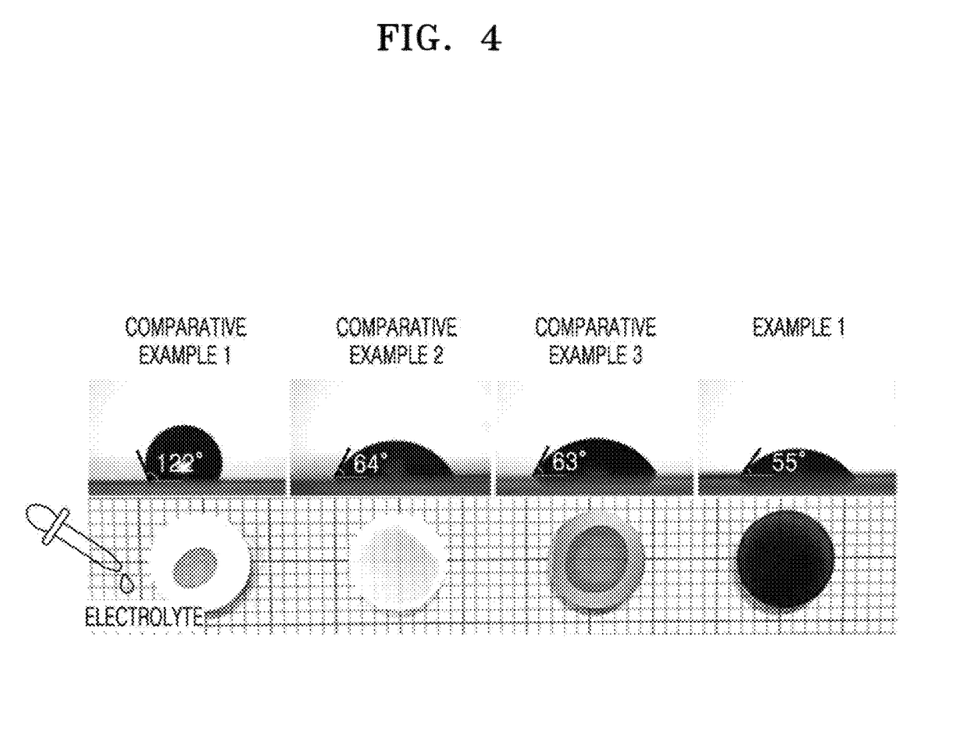
FIG. 4 are diagrams showing wettability of separators prepared in Example 1 and Comparative Examples 1 to 3.

Organic electrolyte-impregnation properties of the separators prepared in Example 1 and Comparative Examples 1 to 3 were tested using an organic electrolyte including a lithium salt and an organic solvent and the results are shown in FIG. 4.

Referring to FIG. 4, it may be seen that the contact angle of the case of Example 1 was smaller than those of Comparative Examples 1 to 3 by about 10° or more and excellent impregnation property was obtained.

Figure 5:
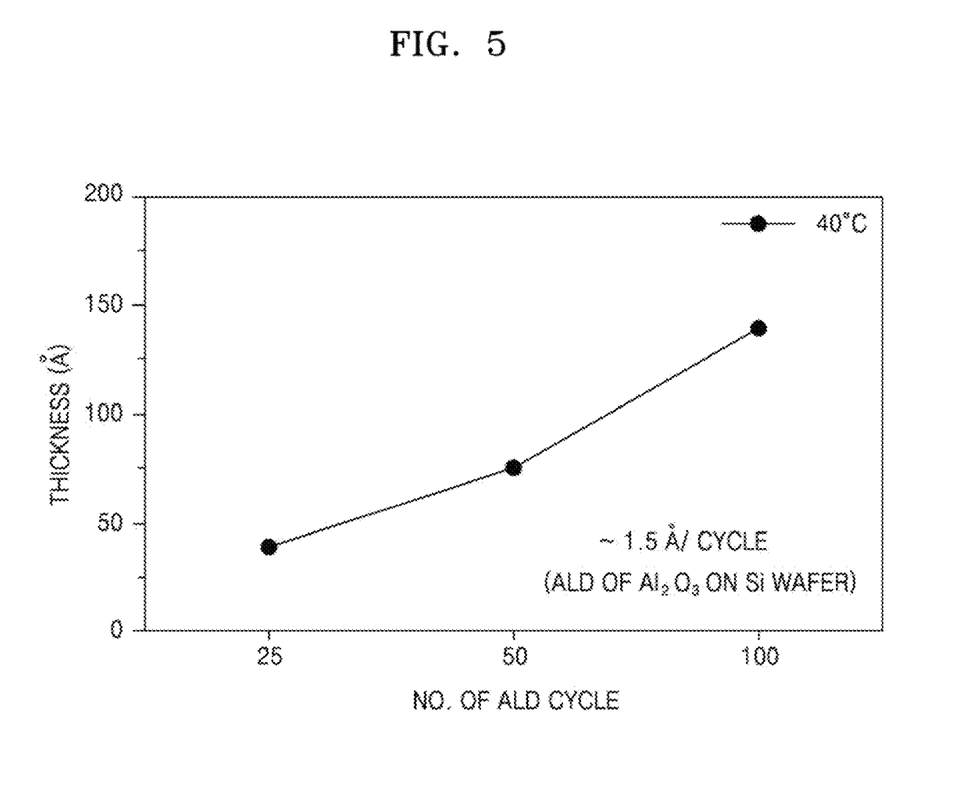
FIG. 5 is a graph showing changes in thickness of an $Al_2O_3$ atomic layer deposition coating layer on a silicon wafer per cycle.

Evaluation Example 4: Measurement of Thickness of $Al_2O_3$ $Al_2O_3$ was deposited on a silicon wafer by ALD in the same manner as in $Al_2O_3$ atomic layer deposition of Example 1. As a result, as shown in FIG. 5, a thickness increase of about 1.5 Å per cycle was confirmed. Therefore, the thickness of $Al_2O_3$ in the composite layer may be calculated as about 3.8 nm in the case of Example 1.

Evaluation Example 5: Optimization of Number of Cycles for ALD of $Al_2O_3$

A polyethylene porous base material (SK innovation Co., Ltd.) having a thickness of 16 μm was prepared. After activating the surface of the polyethylene porous base material by the plasma treatment using an $O_2$ plasm device, $Al_2O_3$ was deposited by ALD. $Al_2O_3$ deposition was performed using trimethylaluminum (TMA) and $H_2O$, as precursors, and nitrogen ($N_2$) gas, as an inert gas and carrier gas, by repeating sequential exposure/purge.

Thereafter, the ratios of Al atoms were identified by XPS analysis while performing the same cycle 25 times, 50 times, and 100 times. The results are shown in the following table.

TABLE 1

| Sample | C (%) | O (%) | Al (%) |
|---|---|---|---|
| PE | 99.79 | 0.21 | — |
| 25 cycles | 29.00 | 49.13 | 21.86 |
| 50 cycles | 19.22 | 54.01 | 26.78 |
| 100 cycles | 19.29 | 53.09 | 27.63 |

As shown in the table, it was confirmed that the Al ratio significantly increased in the 25 cycles, but the increase rates of Al significantly decreased as ALD proceeds 50 times and 100 times. This is considered because Al is sufficiently deposited inside the porous PE and thus most pores are clogged and Al is deposited only on the outer surface of PE. Therefore, in consideration of functions of the separator to transmit an electrolytic solution and lithium ions, ALD was determined to be performed 25 times.

Although an embodiment of the present disclosure has been described in detail above with reference to the accompanying drawings, the present disclosure is not limited thereto. It is clear that various changes and modifications within technical conception defined by claims will become apparent to those skilled in the art. Such changes and modifications are to be understood as being included within the scope of the various embodiments as defined by the appended claims.

The invention claimed is:

1. A separator comprising:
    a web structure of organic fibers; and
    a composite coating layer arranged on the organic fibers, wherein the composite coating layer includes heat-resistant inorganic particles and a hydrophilic organic compound, and has an atomic ratio of aluminum atoms, included in the heat-resistant inorganic particles, to nitrogen atoms, included in the hydrophilic organic compound, of 1:1 to 2:1, and
    wherein the hydrophilic organic compound forms a self-assembled monolayer and comprises an organic compound including a hydroxyl group and an amine group.

2. The separator of claim 1, wherein a thickness of the separator is from 5 μm to 100 μm.

3. The separator of claim 1, wherein a contact angle of the separator with an organic electrolytic solution is 60° or less.

4. The separator of claim 1, wherein a thermal shrinkage of the separator at 140° C. is less than 20%.

5. The separator of claim 1, wherein the web structure of organic fibers is porous.

6. The separator of claim 1, wherein the organic fibers comprise polyethylene fibers, polypropylene fibers, polyisobutylene fibers, polyvinyl chloride fibers, polyvinylidene chloride fibers, polyvinylidenefluoride fibers, polymethylmethacrylate fibers, polyacrylonitrile fibers, polyvinylalcohol fibers, polyethyleneterephthalate fibers, polybutyleneterephthalate fibers, polyimide fibers, polyester fibers, polytetrafluoroethylene fibers, polyamide fibers, polyarylenesulfide fibers, or a combination thereof.

7. The separator of claim 1, wherein the composite coating layer is a base film layer.

8. The separator of claim 1, wherein the composite coating layer is arranged to surround the organic fibers.

9. The separator of claim 1, wherein in the composite coating layer, the hydrophilic organic compound surrounds the heat-resistant inorganic particles.

10. The separator of claim 1, wherein a thickness of the composite coating layer is from 3 nm to 10 nm.

11. The separator of claim 1,
wherein the hydrophilic organic compound comprises a catechol group that includes the hydroxyl group.

12. The separator of claim 1,
wherein the hydrophilic organic compound comprises dopamine, a dopamine derivative, or a combination thereof that includes the hydroxyl group and the amine group.

13. The separator of claim 1, wherein the heat-resistant inorganic particles comprise an inorganic metal oxide, an inorganic metal hydroxide, or a combination thereof.

14. The separator of claim 13, wherein the heat-resistant inorganic particles comprise α-$Al_2O_3$, γ-$Al_2O_3$, Boehmite (γ-AlO(OH)), gibbsite (γ-Al(OH)$_3$), $SiO_2$, $TiO_2$, $SnO_2$, $CeO_2$, $ZrO_2$, CaO, MgO, NiO, ZnO, $Y_2O_3$, $BaTiO_3$, Al(OH)$_3$, Mg(OH)$_2$, or a combination thereof.

15. A secondary battery comprising:
a positive electrode;
a negative electrode; and
the separator of claim 1 interposed between the positive electrode and the negative electrode.

16. The secondary battery of claim 15, wherein the secondary battery is a lithium-sulfur battery, a lithium-air battery, a lithium-ion battery, a sodium-ion battery, or an all-solid battery.

17. A method of preparing a separator, the method comprising:
providing a web structure of organic fibers;
vapor-depositing heat-resistant inorganic particles; and
forming a composite coating layer including a hydrophilic organic compound, the hydrophilic organic compound comprises an organic compound including a hydroxyl group and an amine group, and having an atomic ratio of aluminum atoms, included in the heat-resistant inorganic particles, to nitrogen atoms, included in the hydrophilic organic compound, of 1:1 to 2:1.

18. The method of claim 17, wherein the vapor-depositing is performed by chemical vapor deposition (CVD), atomic layer deposition (ALD), physical vapor deposition (PVD), or a combination thereof.

19. The method of claim 17,
wherein the forming of the composite coating layer is performed by dip coating, press coating, spin coating, spraying, roller coating, or a combination thereof, using a solution including the hydrophilic organic compound.

* * * * *